(12) United States Patent
Banerjee et al.

(10) Patent No.: US 11,101,321 B2
(45) Date of Patent: Aug. 24, 2021

(54) NONVOLATILE RESISTIVE MEMORY DEVICE AND MANUFACTURING METHOD THEREOF

(71) Applicant: INSTITUTE OF MICROELECTRONICS, CHINESE ACADEMY OF SCIENCES, Beijing (CN)

(72) Inventors: Writam Banerjee, Beijing (CN); Ming Liu, Beijing (CN); Qi Liu, Beijing (CN); Hangbing Lv, Beijing (CN); Haitao Sun, Beijing (CN); Kangwei Zhang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 245 days.

(21) Appl. No.: 15/572,035

(22) PCT Filed: Sep. 6, 2015

(86) PCT No.: PCT/CN2015/089003
§ 371 (c)(1),
(2) Date: Nov. 6, 2017

(87) PCT Pub. No.: WO2016/176936
PCT Pub. Date: Nov. 10, 2016

(65) Prior Publication Data
US 2018/0122856 A1    May 3, 2018

(30) Foreign Application Priority Data

May 7, 2015    (CN) .......................... 201510226908.9

(51) Int. Cl.
*H01L 45/00*    (2006.01)
*H01L 27/24*    (2006.01)
(Continued)

(52) U.S. Cl.
CPC .......... *H01L 27/24* (2013.01); *G11C 13/0004* (2013.01); *H01L 27/105* (2013.01);
(Continued)

(58) Field of Classification Search
CPC .. H01I 45/1246; H01I 45/1253; H01I 45/146; H01I 45/1608; H01I 27/24; H01L 45/16;
(Continued)

(56) References Cited

U.S. PATENT DOCUMENTS 8,735,863 B2 *   5/2014   Fowler ..................... H01L 45/00
                                                                257/2
9,082,533 B2 *   7/2015   Yang ....................... H01L 45/08
(Continued)

FOREIGN PATENT DOCUMENTS

CN         102208531 A      10/2011
CN         102593097        7/2012
(Continued)

OTHER PUBLICATIONS

Hong Yu Chen; Electrode/Oxice Interface Engineering by Inserting Single-Layer Graphene: Application for HFO-Based Resistive Random Access Memory; Electron Devices Meeting (IEDM); Dec. 2012; 2012 IEEE International.

*Primary Examiner* — Mohsen Ahmadi
(74) *Attorney, Agent, or Firm* — Dickinson Wright PLLC

(57) ABSTRACT

A nonvolatile resistive switching memory comprising an insulating substrate, a lower electrode, a lower graphene barrier layer, a resistive switching functional layer, an upper graphene barrier layer, and an upper electrode, wherein the lower and/or the upper graphene barrier layer is/are capable of preventing the metal ions/atoms in the lower/upper metal electrode from diffusing into the resistive switching functional layer under an applied electric field. According to the nonvolatile resistive switching memory device of the present (Continued)

invention and manufacturing method thereof, a monolayer or multilayer graphene film as a metal ions/atoms barrier layer is inserted between the upper/lower metal electrode and the resistive switching functional layer, which is capable of preventing the metal ions/atoms in the lower/upper metal electrode from diffusing into the resistive switching functional layer during the programming or erasing process of the resistive switching device, thereby improving the reliability of the device.

10 Claims, 2 Drawing Sheets

(51) Int. Cl.
    *H01L 27/105*      (2006.01)
    *G11C 13/00*      (2006.01)

(52) U.S. Cl.
    CPC .............. *H01L 45/04* (2013.01); *H01L 45/08* (2013.01); *H01L 45/085* (2013.01); *H01L 45/1233* (2013.01); *H01L 45/1246* (2013.01); *H01L 45/1253* (2013.01); *H01L 45/142* (2013.01); *H01L 45/143* (2013.01); *H01L 45/146* (2013.01); *H01L 45/148* (2013.01); *H01L 45/16* (2013.01); *H01L 45/1608* (2013.01); *G11C 13/0007* (2013.01); *G11C 13/0011* (2013.01); *G11C 2213/51* (2013.01)

(58) Field of Classification Search
    CPC .............. H01L 45/1608; H01L 45/146; H01L 27/2463
    See application file for complete search history.

(56) References Cited

U.S. PATENT DOCUMENTS

| | | | |
|---|---|---|---|
| 9,240,550 B2 * | 1/2016 | Dellmann | H01L 45/145 |
| 9,640,757 B2 * | 5/2017 | Zheng | H01L 45/141 |
| 2009/0194839 A1 * | 8/2009 | Bertin | H01L 29/1606 257/476 |
| 2010/0006811 A1 * | 1/2010 | Xu | H01L 27/101 257/2 |
| 2014/0091274 A1 * | 4/2014 | Kim | H01L 45/145 257/4 |
| 2015/0255718 A1 * | 9/2015 | Liu | H01L 45/122 257/4 |
| 2017/0084832 A1 * | 3/2017 | Chen | H01L 45/06 |
| 2017/0365781 A1 * | 12/2017 | Jang | G11C 13/0007 |
| 2018/0019393 A1 * | 1/2018 | Liu | H01L 45/085 |
| 2018/0026183 A1 * | 1/2018 | Liu | H01L 45/143 257/4 |

FOREIGN PATENT DOCUMENTS

| | | |
|---|---|---|
| CN | 103460384 A | 12/2013 |
| CN | 103715197 A | 4/2014 |
| CN | 104538548 A | 4/2015 |
| CN | 104810476 A | 7/2015 |

\* cited by examiner

NONVOLATILE RESISTIVE MEMORY DEVICE AND MANUFACTURING METHOD THEREOF

CROSS-REFERENCE TO RELATED APPLICATIONS

The present application is a 35 U.S.C. Section 371 national stage filing of International Patent Application No. PCT/CN2015/089003, filed 6 Sep. 2015, and through which priority is claimed to Chinese Patent Application CN 20150226908.9, filed 7 May 2015, the disclosures of which are incorporated herein by reference in their entireties.

TECHNICAL FIELD

The present invention relates to the field of semiconductor storage technology, and more particularly to a device unit structure of nonvolatile resistive switching memory (RRAM) containing a graphene barrier layer and the manufacturing method thereof.

BACKGROUND

Storage devices, mainly divided into two categories of volatile and non-volatile, are widely used in integrated circuits and electronic products. So far, the non-volatile Flash memory still occupies the semiconductor memory market. However, during the process of successively size-shrinking, the flash memory technology has encountered more and more difficulties, so some new non-volatile memories have been paid much attention.

Resistive switching memory (RRAM, resistive switching memory) based on metal-insulator-metal (M-I-M) structure is a class of important new non-volatile memories. This type of storage devices has the advantages of high reliability, high density, low power consumption and so on, so it has a wide range of uses in portable electronic products. The resistive switching memory can be switched between high and low resistance states under excitation of an applied voltage (programmed/erasing), and both of the high and the low resistance states can be maintained for a long time in the event of a power failure. In addition, RRAM devices can be used for multi-level storage due to their multi-level resistive switching characteristics.

High durability, good retention characteristics and the stability of switching parameters are the most important parameters of actual application of RRAM. It is generally believed that the resistive switching behavior of RRAM is related to the growth and rupture processes of conductive filaments dominated by diffusion of metal ions or oxygen vacancies. However, the diffusion of additional metal ions into the resistive switching functional layer will cause the reliability of the RRAM device to deteriorate (J. J. Yang, et al., Adv. Mater. 22, 4034, 2010). For example, the diffusion of metal atoms/ions into the inert material will be equivalent to the formation of easily oxidizable metal source at the inert electrode, resulting in erroneous programming phenomenon (e.g. forming metal conductive filaments under the reverse voltage) of such RRAM devices occurring in the reverse erasing process (breaking the conductive filament), significantly impacting on the reliability of the device.

Accordingly, it is very beneficial to prevent the metal ions in the electrode from diffusing into the resistive switching functional layer in order to improve the performance of the device.

SUMMARY

In view of the above, it is an object of the present invention to overcome the above technical difficulties and to overcome the problem that the reliability of the device is deteriorated due to the metal electrode material entering into the resistive switching functional layer in the RRAM memory device. There is provided a novel device structure with a monolayer or multi-layer graphene barrier layer inserted between the metal electrode and the resistive switching functional layer, improving the reliability of the device.

To this end, the present invention provides a nonvolatile resistive switching memory comprising an insulating substrate, a lower electrode, a lower graphene barrier layer, a resistive switching functional layer, an upper graphene barrier layer, and an upper electrode, wherein the lower and/or the upper graphene barrier layer is/are capable of preventing the metal ions/atoms in the lower and/or the upper metal material from diffusing into the resistive switching functional layer under an applied electric field.

Wherein the material of the lower electrode and/or the upper electrode is a metal, a metal alloy of the said metal, a conductive oxide of the said metal, a conductive nitride of the said metal, or a conductive silicide of the said metal; optionally, the said metal is selected from any one of Pt, Au, W, Pd, Cu, Ag, Ni, Al, Ti, Ta, Co, Ir, and Zn, or a combination thereof.

Wherein the thickness of the lower electrode and/or the upper electrode is 2 nm to 500 nm; optionally, the thickness of the lower electrode is smaller than that of the upper electrode.

Wherein the material of the resistive switching functional layer is a solid electrolyte or a binary oxide material having resistive switching properties, such as anyone of CuS, AgS, AgGeSe, $CuI_xS_y$, $ZrO_X$, $HfO_X$, $TiO_X$, $SiO_X$, $WO_x$, NiO, $CuO_x$, ZnO, $TaO_x$, and $YO_X$, or a combination thereof; optionally, the thickness thereof is 2 nm to 200 nm.

Wherein the lower and/or the upper graphene barrier layer is/are a monolayer or a multiple layer structure; optionally, the thickness of the lower and/or the upper graphene barrier layer is 0.5 nm to 20 nm; optionally, the thickness of the lower graphene barrier layer is smaller than that of the upper graphene barrier layer.

The present invention also provides a method of manufacturing the nonvolatile resistive switching memory comprising: forming a lower electrode on an insulating substrate; forming a lower graphene barrier layer on the lower electrode; forming a resistive switching functional layer on the lower electrode; forming an upper graphene barrier layer on the resistive switching functional layer; and forming an upper electrode on the upper graphene barrier layer.

Wherein the process of forming the lower and/or the upper electrode is electron beam evaporation, chemical vapor deposition, pulsed laser deposition, atomic layer deposition, or magnetron sputtering; optionally, the thickness of the lower electrode and/or the upper electrode is 2 nm to 500 nm.

Wherein the process of forming the resistive switching functional layer is electron beam evaporation, pulsed laser deposition, magnetron sputtering or sol-gel method; optionally, the thickness of the resistive switching functional layer is 2 nm to 200 nm.

Wherein the process of forming the lower and/or the upper graphene barrier layer is film transferring, optionally tape stripping or chemical vapor deposition; optionally, the thickness of the lower and/or the upper graphene barrier layer is 0.5 nm to 20 nm.

Wherein the material of the lower electrode and/or the upper electrode is a metal, a metal alloy of the said metal, a conductive oxide of the said metal, a conductive nitride of the said metal, or a conductive silicide of the said metal; optionally, the said metal is selected from any one of Pt, Au, W, Pd, Cu, Ag, Ni, Al, Ti, Ta, Co, Ir, and Zn, or a combination thereof; the material of the resistive switching functional layer is a solid electrolyte or a binary oxide material having resistive switching properties, such as anyone of CuS, AgS, AgGeSe, $CuI_xS_y$, $ZrO_x$, $HfO_x$, $TiO_x$, $SiO_x$, $WO_x$, NiO, $CuO_x$, ZnO, $TaO_x$, and $YO_x$, or a combination thereof.

Wherein a periodic structure is formed on the surface of the lower electrode; optionally, the polycrystalline upper electrode is transformed into a single crystal, or the crystal domains thereof are enlarged.

According to the nonvolatile resistive switching memory device and the manufacturing method of the present invention, a monolayer or multilayer graphene film as a metal ions/atoms barrier layer is inserted between the upper/lower metal electrode and the resistive switching functional layer, which is capable of preventing the metal ions/atoms in the upper/lower metal electrodes from diffusing into the resistive switching functional layer during the programming or erasing process of the resistive switching device, thereby improving the reliability of the device.

BRIEF DESCRIPTION OF THE DRAWINGS

The technical solution of the present invention will be described in detail below with reference to the accompanying drawings, in which.

DETAILED DESCRIPTION

The characters and technical effects of the present invention will be described in detail by referring the drawings and accommodate with schematic embodiments, disclosing a nonvolatile resistive switching memory device and manufacturing method thereof including a graphene barrier layer for preventing metal ions from diffusing into resistive switching functional layer to cause erroneous programming phenomena. It should be noted that the similar signs denote the similar structure. The terms used in the present invention like 'first', 'second', 'up/upon', 'down/low/beneath/under' etc. can be used in denoting various device structures, and unless specially illuminated these terms don't imply to the relationship of space, sequence or hierarchy of the device structures.

Figure 1:
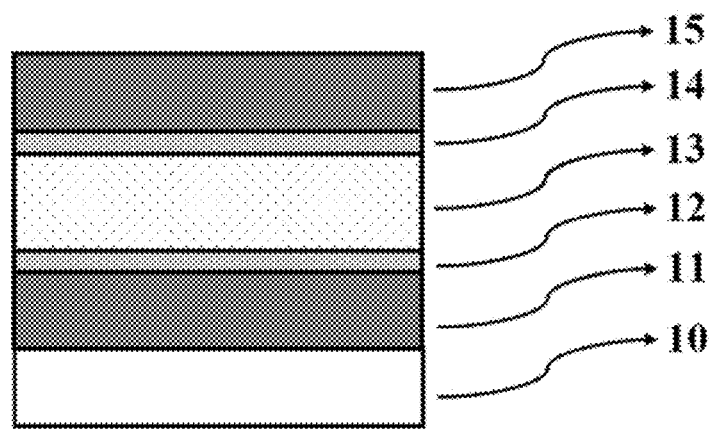
FIG. 1 is a sectional view of a nonvolatile resistive switching memory device according to one embodiment of the present invention.

As shown in FIG. 1, a sectional view of a resistive switching memory device according to the present invention is shown, including a insulating substrate 10, a lower conductive electrode 11, a (first or lower) graphene barrier layer 12, a resistive switching functional layer 13, a (second or upper) graphene barrier layer 14, and an upper conductive electrode 15, wherein the material of the lower electrode 11 and/or the upper electrode 15 is a conductive metal element (e.g., Pt, Au, W, Pd, Cu, Ag, Ni, Al, Ti, Ta, Co, Ir, or Zn, etc.), a conductive metal alloy of the metal elements (alloy composed of aforementioned metal elements), a conductive oxide of the said metal elements ($IrO_x$, ITO, IZO, IGZO, or AZO, etc.), a conductive nitride of the said metal elements (TiN, TaN, or WN, etc.), or a conductive silicide of the said metal elements (NiSi, PtSi, TiSi, WSi, or CoSi, etc.). Preferably, the lower conductive electrode 11 has a thickness smaller than that of the upper conductive electrode 15 so as to reduce the series resistance by thickening the upper electrode.

The resistive switching functional layer 13 is made of a solid electrolyte or a binary oxide material having a resistance transition characteristic, for instance any one of CuS, AgS, AgGeSe, $CuI_xS_y$, $ZrO_x$, $HfO_x$, $TiO_x$, $SiO_x$, $WO_x$, NiO, $CuO_x$, ZnO, $TaO_x$, and $YO_x$, or a combination (including mixing, lamination, doping modification and the like) thereof.

The applicant has found that graphene is a layered structure in which the carbon atoms are periodically formed by SP2 orbital hybridization, having good thermal stability and good electrical conductivity. As a hexagonal grid of two-dimensional structure, the diameter of the hexagonal cavity of graphene is 65 pm, much smaller than the atomic size or ion size of most atoms, so graphene is a very effective atomic diffusion barrier material. Thus, the applicant inserts at least two graphene barrier layers 12/14 (at least as monolayer, or also be multiple layers) between the resistive switching functional layer 13 and the upper/lower electrodes 11/15. During the process of programming/erasing, the graphene barrier layer will prevent the metal ions/atoms in the upper and lower electrode layers from diffusing into the resistive switching functional layer, so as to achieve the purpose of improving the reliability of the device. Preferably, in order to further enhance the blocking of metal ion/atom diffusion, the graphene barrier layer 12 and/or 14 is a multilayer stack of graphene having a thickness ranging from 0.5 nm of monolayer to 50 nm of multiple layers (e.g., 100 layers, preferably the upper limit to 40 layers, 20 nm).

Figure 2:
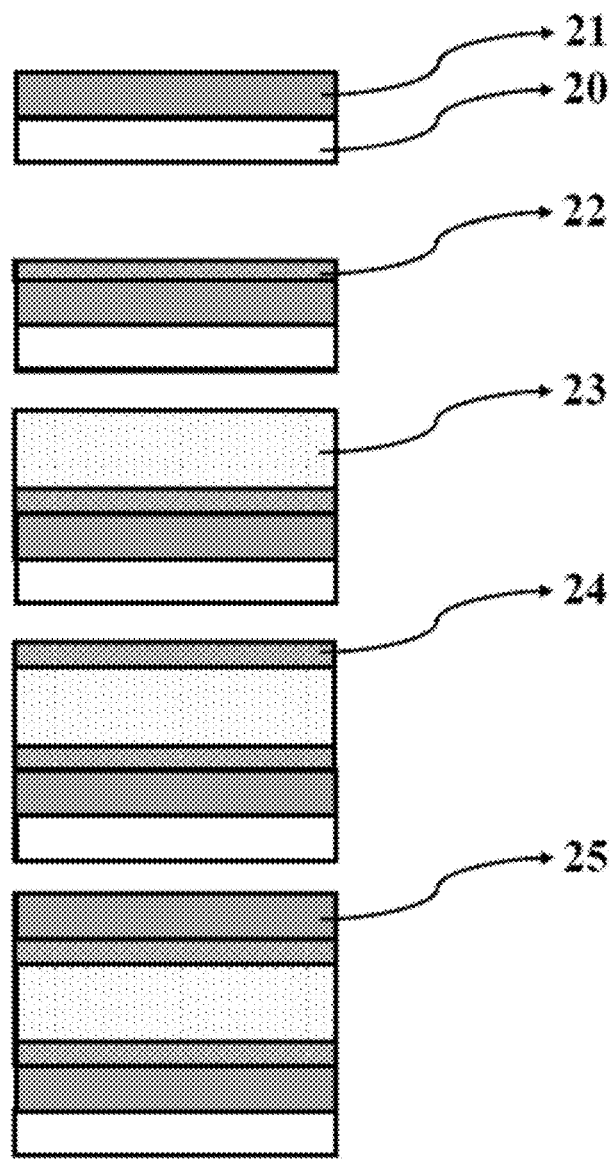
FIG. 2 are sectional views of a method of manufacturing the nonvolatile resistive switching memory device according to one embodiment of the present invention.

As shown in FIG. 2, the sectional views corresponding to the respective steps of the method of manufacturing the resistive switching memory device according to the present invention are shown.

Specifically, a lower conductive electrode 21 is formed on an insulating substrate 20. The insulating substrate 20 is provided, which may be a hard substrate such as silicon oxide on Si substrate, buried oxygen layer of SOI substrate, sapphire (alumina), aluminum nitride, glass, quartz, or flexible substrates such as resin, or plastic etc. The lower conductive electrode 21 is deposited on the insulating substrate 20 by electron beam evaporation, chemical vapor deposition (including PECVD, HDPCVD, or MOCVD, etc.), pulsed laser deposition, atomic layer deposition, or magnetron sputtering. The material of the lower electrode 21 is a conductive metal element (e.g., Pt, Au, W, Pd, Cu, Ag, Ni, Al, Ti, Ta, or Co, etc.), a conductive metal alloy of the metal elements (alloy composed of aforementioned metal elements), a conductive oxide of the said metal elements ($IrO_x$, ITO, IZO, IGZO, or AZO, etc.), a conductive nitride of the said metal elements (TiN, TaN, or WN, etc.), a conductive silicide of the said metal elements (NiSi, PtSi, TiSi, WSi, or CoSi, etc.). The thickness of the lower electrode 21 is from 2 nm to 500 nm, preferably 2 to 300 nm and optimally 3 to 100 nm, for example, 50 nm. Preferably, a periodic pattern (not shown) is formed on the top surface of the lower electrode 21 by using a mask plate or periodically controlling the deposition process parameters, or etching after deposition, in order to increase the contact area between the lower electrode 21 and the graphene barrier layer and the resistive switching functional layer thereon, thereby improving the efficiency of programming and erasing.

Subsequently, a graphene barrier layer 22 is formed on the lower electrode 21. The graphene layer is prepared, for example, by film transfer, such as by tape stripping, or by CVD deposition or sol-gel deposition on a temporary substrate (not shown) and then bonding to the substrate 20 comprising the lower electrode 21, followed by mechanical, thermal or laser stripping of the temporary substrate, only leaving the graphene barrier layer 22 on the lower electrode 21. In addition, graphene may be deposited directly on the lower electrode 21 by a CVD method such as PECVD, HDPCVD or the like. The thickness of the graphene layer 22 is, for example, 0.5 nm to 50 nm, preferably 1 nm to 40 nm, more preferably 5 nm to 20 nm, and optimally 10 nm.

Next, a resistive switching functional layer 23 is formed on the graphene barrier layer 22. The resistive switching function layer 23 may also be referred to as a resistive memory medium layer, playing the insulating and isolation function between the lower/upper electrodes 21/25. The formation process of the resistive switching functional layer 23 is electron beam evaporation, pulsed laser deposition, magnetron sputtering, or sol-gel method. The material of the resistive switching functional layer 23 is a solid electrolyte or a binary oxide material having a resistance switching characteristic, specifically any one of CuS, AgS, AgGeSe, CuIxSy, ZrOX, HfOX, TiOX, SiOX, WOx, NiO, CuOx, ZnO, TaOx, and YOX, or a combination thereof (including mixing, lamination, doping modification and the like), the thickness thereof is in the range of 2 nm to 200 nm, preferably 5 nm to 100 nm, preferably 10 nm to 60 nm, and optimally 40 nm. Preferably, the resistive switching function layer 23 has a flat top surface.

Subsequently, another graphene barrier layer 24 is formed on the resistive switching functional layer 23. Graphene barrier layer 24 and 22 have the same or similar process, material and thickness. Preferably, since the thickness of future upper electrode will be greater than that of the lower electrode, in order to prevent the metal ions/atoms which are in excess amount or kinetic energy from penetrating the graphene barrier layer 24 during the thicker electrode deposition, and namely in order to improve the protecting performance for thicker metal electrode, in a preferred embodiment of the present invention, the thickness of upper graphene barrier layer 24 adjacent to the upper electrode 25 is adjusted to be greater than that of the lower graphene barrier layer 22. For example, the thickness of the upper electrode 25 is n times of the thickness of the lower electrode 21, wherein n is 1 or greater, for example, 1.5 to 8, for example, 2 to 6, for example, 3 to 5, for example, 4; while the thickness of the upper graphene barrier layer 24 is m times of the thickness of the lower graphene barrier layer 22, wherein m is greater than or equal to n, for example, m is greater than or equal to 2, or ranging from 3 to 10, from 4 to 8, such as 5.

Finally, an upper conductive electrode 25 is formed on the graphene barrier layer 24 by electron beam evaporation, chemical vapor deposition, pulsed laser deposition, atomic layer deposition or magnetron sputtering. The upper conductive electrode 25 is made of an inert metal material, same or similar material with the lower electrode 21. The thickness thereof is, for example, 5 nm to 500 nm, preferably 10 to 300 nm and optimally 50 to 100 nm, for example 80 nm. Preferably, by controlling the process temperature of deposition and sputtering, or by performing additional rapid annealing (RTA) or laser annealing (the temperature and the time of annealing cannot exceed the limitation of the resistive functional layer 23) after the formation of the electrode 25, the polycrystalline structure of the electrode 25 (due to the temperature sensitivity of the resistive switching functional layer in the resistive switching memory, it is usually polycrystalline) is converted into a single crystal or enlarged in crystal domain. In this process, due to the good heat dissipation of the graphene barrier layer 24/22, the effect of isolation protection is further achieved, reducing the heat or laser energy conducted to the resistive switching function layer, thereby making it possible to reduce the gap defects on the surface of the electrode 25 without changing the characteristic of solid electrolyte in the resistive switching function layer, further prevent the metal ions in the lower/upper electrodes 21/25 from diffusing into the resistive switching material 23 through the graphene barrier layer 22/24 under a large applied electric field, thereby completely avoiding erroneous programming and significantly improving device reliability.

In one embodiment of the present invention, a W film having a thickness of 70 nm is formed as a lower conductive electrode layer by electron beam evaporation process on a Si substrate with an insulating layer of 200 nm thickness; and then, using solution transfer method, the graphene film is transferred to the lower electrode layer, and then a layer of 20 nm $HfO_2$ resistive switching functional layer was deposited by magnetron sputtering deposition method; then, using solution transfer method again, the graphene film is further transferred to the $HfO_2$ film, and finally 100 nm Ti is evaporated using the electron beam as the upper conductive electrode layer to complete the basic structure of the whole device. FIG. 2 show the schematic diagrams of the process flow of this embodiment. By comparing the electrical characteristics with that of the nonvolatile resistive memory device grown under the same process conditions without the graphene barrier layer, it has been found that the inserting of the graphene barrier layers can significantly improve the device's durability, data retention properties and reliability of the device.

According to the nonvolatile resistive switching memory device of the present invention and manufacturing method thereof, a monolayer or multilayer graphene film as a barrier layer for metal ions/atoms is inserted between the upper/lower metal electrode and the resistive switching functional layer, which is capable of preventing the metal ions/atoms in the lower and upper metal material from diffusing into the resistive switching functional layer during the programming or erasing process of the resistive switching device, thereby improving the reliability of the device.

Although the present invention is descried with one or more specifically exemplary embodiments, one skilled in the art will recognize that various appropriate changes and equivalents of the device structure can be made without departing from the scope of the present invention. Furthermore, a great deal of modifications of specifical situation or materials can be made to the disclosed enlightenment without departing from the scope of the present invention. Thus, the intent of the present invention is not limiting itself to the disclosed specifically exemplary embodiments for implementing the best implementary manner, by contraries, the disclosed device structures and the method of manufacturing the same will include all the exemplary embodiments within the scope of the invention.

The invention claimed is:

1. A method of manufacturing a nonvolatile resistive switching, memory comprising the steps of:

forming a lower electrode on an insulating substrate;

forming a lower graphene barrier layer on the lower electrode;

forming a resistive switching functional layer on the lower graphene barrier layer;

forming an upper graphene barrier layer on the resistive switching functional layer;

forming a polycrystalline upper electrode on the upper graphene barrier layer, wherein the thickness of the upper electrode is n times the thickness of the lower electrode, while the thickness of the upper graphene barrier layer is m times the thickness of the lower graphene barrier layer, wherein m is greater than n, and n is equal to or greater than 1 and m is equal to or greater than 2, wherein the thickness of the upper electrode is greater than that of the lower electrode, and the thickness of the upper graphene barrier layer prevents metal ions/atoms which are in excess amount or kinetic energy from penetrating the upper graphene barrier layer during electrode deposition so as to prevent the metal ions/atoms in the polycrystalline upper electrode from diffusing into the resistive witching layer through the upper graphene barrier layer;

performing rapid thermal annealing to convert the polycrystalline upper electrode into a single crystal or to enlarge its crystal domain; and reducing heat or laser energy conducted to the resistive switching functional layer during conversion of a polycrystalline structure of the polycrystalline upper electrode into the single crystal or to enlarge its crystal domain to reduce any gap defects on a surface of the upper electrode without changing a characteristic of a solid electrolyte in the resistive switching functional layer.

2. The method of manufacturing the nonvolatile resistive switching memory according to claim 1, wherein the process of forming the lower and/or upper electrode is electron beam evaporation, chemical vapor deposition, pulsed laser deposition, atomic layer deposition, or magnetron sputtering.

3. The method of manufacturing the nonvolatile resistive switching memory according to claim 2, wherein the thickness of the lower electrode and/or the upper electrode is 2 nm to 500 nm.

4. The method of manufacturing the nonvolatile resistive switching memory according to claim 1, wherein the process of forming the resistive switching functional layer is electron beam evaporation, pulsed laser deposition, magnetron sputtering or sol-gel method.

5. The method of manufacturing the nonvolatile resistive switching memory according to claim 4, wherein the thickness of the resistive switching functional layer is 2 nm to 200 nm.

6. The method of manufacturing the nonvolatile resistive switching memory according to claim 1, wherein the process of forming the lower and/or upper graphene barrier layer is film transferring, tape stripping or chemical vapor deposition.

7. The method of manufacturing the nonvolatile resistive switching memory according to claim 6, wherein the thickness of the lower and/or the upper graphene barrier layer is 0.5 nm to 20 nm.

8. The method of manufacturing the nonvolatile resistive switching memory according to claim 1, wherein the material of the lower electrode and/or the upper electrode is a metal, a metal alloy of the said metal, a conductive oxide of the said metal, a conductive nitride of the said metal, or a conductive silicide of the said metal; the material of the resistive switching functional layer is the solid electrolyte or a binary oxide material having resistive s witching properties.

9. The method of manufacturing the nonvolatile resistive switching memory according to claim 8, wherein the material of the lower electrode and/or the upper electrode is a metal selected from any one of Pt, Au, W, Pd, Cu, Ag, Ni, Al, Ti, Ta, Co, Ir, and Zn, or a combination thereof.

10. The method of manufacturing the nonvolatile resistive switching memory according to claim 8, wherein the material of the resistive switching functional layer is ay of CuS, AgS, AgGeSe, $CuI_xS_y$, $ZrO_x$, $HfO_x$, $TiO_x$, $SiO_x$, $WO_x$, NiO, $CuO_x$, ZnO, $TaO_x$, and $YO_x$, or a combination thereof.

* * * * *